(12) United States Patent
Taniguchi et al.

(10) Patent No.: US 9,748,925 B2
(45) Date of Patent: Aug. 29, 2017

(54) PIEZOELECTRIC THIN FILM RESONATOR INCLUDING AN INSERTION FILM, FILTER, AND DUPLEXER

(71) Applicant: TAIYO YUDEN CO., LTD., Tokyo (JP)

(72) Inventors: Shinji Taniguchi, Tokyo (JP); Tokihiro Nishihara, Tokyo (JP); Tsuyoshi Yokoyama, Tokyo (JP); Takeshi Sakashita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 111 days.

(21) Appl. No.: 14/824,778

(22) Filed: Aug. 12, 2015

(65) Prior Publication Data
US 2016/0142038 A1    May 19, 2016

(30) Foreign Application Priority Data
Nov. 14, 2014   (JP) ................. 2014-231794

(51) Int. Cl.
*H03H 9/70*  (2006.01)
*H03H 9/15*  (2006.01)
(Continued)

(52) U.S. Cl.
CPC ........ *H03H 9/706* (2013.01); *H03H 9/02015* (2013.01); *H03H 9/02118* (2013.01);
(Continued)

(58) Field of Classification Search
CPC .... H03H 9/02118; H03H 9/173; H03H 9/175; H03H 9/568; H03H 9/706; H03H 3/02;
(Continued)

(56) References Cited

U.S. PATENT DOCUMENTS 4,456,850 A * 6/1984 Inoue ................. H03H 9/02102
                                                     310/324
7,714,684 B2 * 5/2010 Ruby ....................... H03H 3/02
                                                     310/322
(Continued)

FOREIGN PATENT DOCUMENTS

JP   2006-109472 A   4/2006
JP   2014-161001 A   9/2014

*Primary Examiner* — Barbara Summons
(74) *Attorney, Agent, or Firm* — Chen Yoshimura LLP

(57) ABSTRACT

A piezoelectric thin film resonator includes: a substrate; a piezoelectric film located on the substrate; a lower electrode and an upper electrode facing each other across at least a part of the piezoelectric film; and an insertion film inserted in the piezoelectric film, located in at least a part of an outer peripheral region within a resonance region where the lower electrode and the upper electrode face each other across the piezoelectric film, and not located in a center region of the resonance region, wherein a difference between a total film thickness of the piezoelectric film and the insertion film in a first region, in which the insertion film is inserted, within the resonance region and a film thickness of the piezoelectric film in a second region, in which the insertion film is not inserted, is less than a film thickness of the insertion film.

8 Claims, 18 Drawing Sheets

(51) Int. Cl.
*H03H 9/56* (2006.01)
*H03H 9/02* (2006.01)
*H03H 9/17* (2006.01)
*H03H 3/02* (2006.01)

(52) U.S. Cl.
CPC ............ *H03H 9/173* (2013.01); *H03H 9/175* (2013.01); *H03H 9/564* (2013.01); *H03H 9/568* (2013.01); *H03H 3/02* (2013.01); *H03H 2003/021* (2013.01)

(58) Field of Classification Search
CPC ......... H03H 2003/021; H03H 9/02015; H03H 9/564
USPC ........................................ 333/133, 187, 189
See application file for complete search history.

(56) References Cited

U.S. PATENT DOCUMENTS

| | | | |
|---|---|---|---|
| 7,791,434 B2* | 9/2010 | Fazzio | H03H 9/173 310/324 |
| 9,344,059 B2* | 5/2016 | Nishihara | H03H 9/70 |
| 2006/0103492 A1 | 5/2006 | Feng et al. | |
| 2010/0033063 A1* | 2/2010 | Nishihara | H03H 9/02118 310/365 |
| 2012/0218060 A1* | 8/2012 | Burak | H03H 3/04 333/191 |
| 2013/0038408 A1* | 2/2013 | Burak | H03H 9/132 333/187 |
| 2014/0210570 A1 | 7/2014 | Nishihara et al. | |

* cited by examiner

PIEZOELECTRIC THIN FILM RESONATOR INCLUDING AN INSERTION FILM, FILTER, AND DUPLEXER

CROSS-REFERENCE TO RELATED APPLICATION

This application is based upon and claims the benefit of priority of the prior Japanese Patent Application No. 2014-231794, filed on Nov. 14, 2014, the entire contents of which are incorporated herein by reference.

FIELD

A certain aspect of the present invention relates to a piezoelectric thin film resonator, a filter, and a duplexer.

BACKGROUND

Acoustic wave devices employing a piezoelectric thin film resonator are used as filters and duplexers of wireless devices such as mobile phones. The piezoelectric thin film resonator has a structure designed to have a lower electrode and an upper electrode facing each other across a piezoelectric film. A region where the lower electrode and the upper electrode face each other across the piezoelectric film is a resonance region.

Rapid diffusion of wireless system leads to usage of many frequency bands. This requires the filter and the duplexer to have steep skirt characteristics. Increasing the Q-value of the piezoelectric thin film resonator is one way to achieve steep skirt characteristics.

Japanese Patent Application Publication No. 2014-161001 (Patent Document 1) discloses inserting an insertion film in the piezoelectric film in the outer peripheral region of the resonance region.

The piezoelectric thin film resonator disclosed in Patent Document 1 can reduce the leakage of acoustic wave energy from the resonance region, enabling to improve the Q-value. However, the insertion film makes the upper surface of the piezoelectric film uneven in Patent Document 1. This deteriorates the characteristics such as the Q-value.

SUMMARY OF THE INVENTION

According to an aspect of the present invention, there is provided a piezoelectric thin film resonator including: a substrate; a piezoelectric film located on the substrate; a lower electrode and an upper electrode facing each other across at least a part of the piezoelectric film; and an insertion film inserted in the piezoelectric film, located in at least a part of an outer peripheral region within a resonance region, and not located in a center region of the resonance region, the resonance region being a region where the lower electrode and the upper electrode face each other across the piezoelectric film, wherein a difference between a total film thickness of the piezoelectric film and the insertion film in a first region within the resonance region and a film thickness of the piezoelectric film in a second region is less than a film thickness of the insertion film, the first region being a region in which the insertion film is inserted, and the second region being a region in which the insertion film is not inserted.

According to another aspect of the present invention, there is provided a filter including the above piezoelectric thin film resonator.

According to another aspect of the present invention, there is provided a duplexer including: a transmit filter; and a receive filter, wherein at least one of the transmit filter and the receive filter is the above filter.

DETAILED DESCRIPTION

Figure 1A:
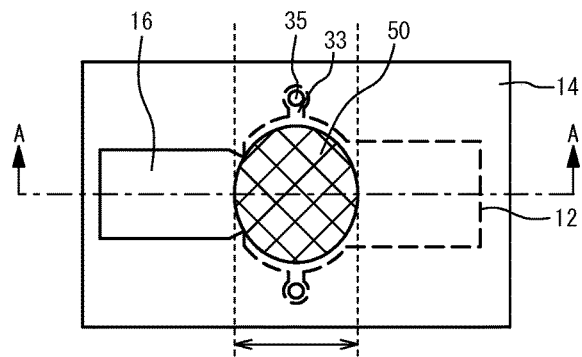
FIG. 1A is a plan view of a piezoelectric thin film resonator employed in a first embodiment.
Figure 1B:
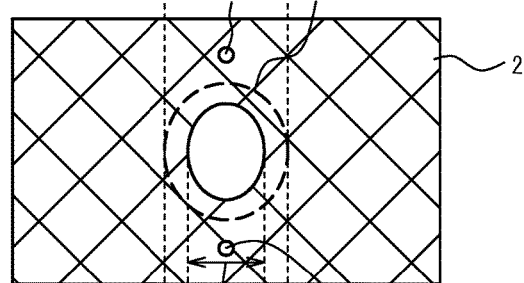
FIG. 1B is a plan view of an insertion film.
Figure 1C:
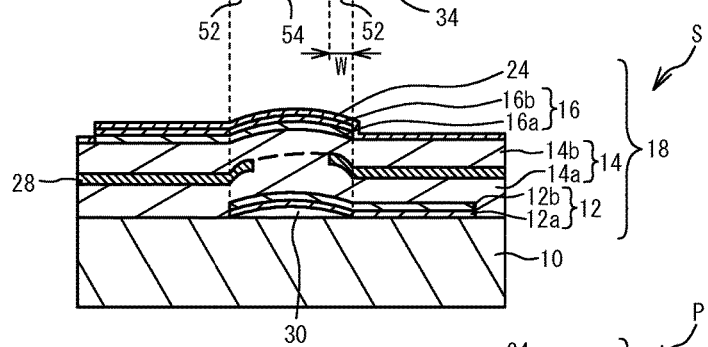
FIG. 1C and FIG. 1D are cross-sectional views taken along line A-A in FIG. 1A.
Figure 1D:
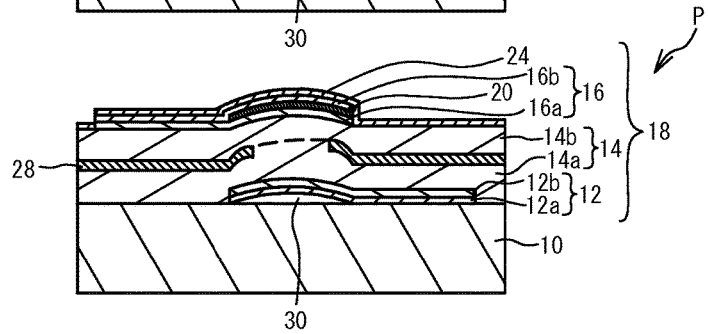

A description will now be given of embodiments of the present invention with reference to the attached drawings.
First Embodiment FIG. 1A is a plan view of a piezoelectric thin film resonator employed in a first embodiment, FIG. 1B is a plan view of an insertion film, and FIG. 1C and FIG. 1D are cross-sectional views taken along line A-A in FIG. 1A. FIG. 1C illustrates a series resonator of, for example, a ladder-type filter, and FIG. 1D illustrates a parallel resonator of, for example, a ladder-type filter.

With reference to FIG. 1A and FIG. 1C, a description will now be given of a structure of a series resonator S. A lower electrode 12 is located on a substrate 10 that is a silicon (Si) substrate. An air gap 30 having a dome-shaped bulge is formed between the flat principal surface of the substrate 10 and the lower electrode 12. The dome-shaped bulge is a bulge having a shape in which the height of the air gap 30 is low in the periphery of the air gap 30 and the height of the air gap 30 increases at closer distances to the center of the air gap 30. The lower electrode 12 includes a lower layer 12a and an upper layer 12b. The lower layer 12a is, for example, a chrome (Cr) film, and the upper layer 12b is, for example, a ruthenium (Ru) film.

On the lower electrode 12, located is a piezoelectric film 14 mainly composed of aluminum nitride (AlN) having a main axis in the (002) direction. The piezoelectric film 14 includes a lower piezoelectric film 14a and an upper piezoelectric film 14b. An insertion film 28 is located between the lower piezoelectric film 14a and the upper piezoelectric film 14b. A recessed portion is formed in the upper surface of the lower piezoelectric film 14a, and the insertion film 28 is embedded in the recessed portion. The upper surface of the lower piezoelectric film 14a and the upper surface of the insertion film 28 form a substantially continuous surface.

An upper electrode 16 is located on the piezoelectric film 14 so as to have a region (a resonance region 50) facing the lower electrode 12 across the piezoelectric film 14. The resonance region 50 has a shape of an ellipse, and is a region where an acoustic wave in a thickness extension mode resonates. The upper electrode 16 includes a lower layer 16a and an upper layer 16b. The lower layer 16a is, for example, a Ru film, and the upper layer 16b is, for example, a Cr film.

On the upper electrode 16, formed is a silicon oxide film as a frequency adjusting film 24. A multilayered film 18 within the resonance region 50 includes the lower electrode 12, the piezoelectric film 14, the insertion film 28, the upper electrode 16, and the frequency adjusting film 24. The frequency adjusting film 24 may act as a passivation film.

As illustrated in FIG. 1A, an introduction path 33 to etch a sacrifice layer is formed in the lower electrode 12. The sacrifice layer is a layer to form the air gap 30. The piezoelectric film 14 does not cover the portion near the tip of the introduction path 33, and the lower electrode 12 has a hole portion 35 at the tip of the introduction path 33.

With reference to FIG. 1D, a description will be given of a structure of a parallel resonator P. The parallel resonator P differs from the series resonator S in that a mass load film 20 made of a titanium (Ti) layer is formed between the lower layer 16a and the upper layer 16b of the upper electrode 16. Thus, the multilayered film 18 includes the mass load film 20 formed across the entire surface within the resonance region 50 in addition to the multilayered film of the series resonator S. Other structures are the same as those of the series resonator S illustrated in FIG. 1C, and thus the description is omitted.

The film thickness of the mass load film 20 is used to adjust a difference in resonant frequency between the series resonator S and the parallel resonator P. The film thickness of the frequency adjusting film 24 is adjusted to adjust the resonant frequencies of the series resonator S and the parallel resonator P.

When the piezoelectric thin film resonator has a resonant frequency of 2 GHz, the lower layer 12a of the lower electrode 12 is a Cr film with a film thickness of 100 nm, and the upper layer 12b is a Ru film with a film thickness of 200 nm. The lower piezoelectric film 14a is an AlN film with a film thickness of 705 nm, and the upper piezoelectric film 14b is an AlN film with a film thickness of 505 nm. The insertion film 28 is a silicon oxide ($SiO_2$) film with a film thickness of 150 nm. The lower layer 16a of the upper electrode 16 is a Ru film with a film thickness of 230 nm, and the upper layer 16b is a Cr film with a film thickness of 50 nm. The frequency adjusting film 24 is a silicon oxide film with a film thickness of 50 nm. The mass load film 20 is a Ti film with a film thickness of 120 nm. The film thickness of each layer is appropriately set to obtain desired resonance characteristics.

As illustrated in FIG. 1B, the insertion film 28 is located in an outer peripheral region 52 within the resonance region 50, but is not located in a center region 54. The outer peripheral region 52 is a region within the resonance region 50, includes the outer periphery of the resonance region 50, and is a region along the outer periphery. The outer peripheral region 52 is strip-shaped or ring-shaped. The center region 54 is a region within the resonance region 50, and includes the center of the resonance region 50. The center may not be the geometric center. The insertion film 28 is continuously located from the outer peripheral region 52 to the outside of the resonance region 50. A hole portion 34 corresponding to the hole portion 35 is formed in the insertion film 28. As illustrated in FIG. 3 of Patent Document 1, the insertion film 28 preferably has a Young's modulus less than that of the piezoelectric film 14. This enables to improve the Q-value. Moreover, the usage of a metal film for the insertion film 28 enables to improve the effective electromechanical coupling coefficient. Furthermore, to make the insertion film 28 have a Young's modulus less than that of the piezoelectric film 14, the insertion film 28 is preferably an Al film, a gold (Au) film, a copper (Cu) film, a Ti film, a platinum (Pt) film, a tantalum (Ta) film, a Cr film, or a silicon oxide film when the piezoelectric film 14 is mainly composed of aluminum nitride. Especially, to achieve the above described Young's modulus, the insertion film 28 is preferably an Al film or a silicon oxide film.

Instead of a Si substrate, the substrate 10 may be, for example, a quartz substrate, a glass substrate, a ceramic substrate, or a GaAs substrate. The lower electrode 12 and the upper electrode 16 may be a single-layer film of Al, Ti, Cu, molybdenum (Mo), tungsten (W), Ta, Pt, rhodium (Rh), or iridium (Ir), or a multilayered film of them instead of Ru and Cr. For example, the lower layer 16a of the upper electrode 16 may be made of Ru, and the upper layer 16b may be made of Mo.

The piezoelectric film 14 may be made of, for example, zinc oxide (ZnO), lead zirconate titanate (PZT), or lead titanate ($PbTiO_3$) instead of aluminum nitride. Alternatively, the piezoelectric film 14 may be mainly composed of aluminum nitride, and include other element for improving the resonance characteristics or for improving the piezoelectricity. For example, the usage of scandium (Sc), two elements of divalent and quadrivalent elements, or two elements of divalent and pentavalent elements as an additive element improves the piezoelectricity of the piezoelectric film 14. Thus, the effective electromechanical coupling coefficient of the piezoelectric thin film resonator can be improved. The divalent element is, for example, calcium (Ca), magnesium (Mg), strontium (Sr), or zinc (Zn). The quadrivalent element is, for example, Ti, zirconium (Zr), or hafnium (Hf). The pentavalent is, for example, Ta, niobium (Nb), or vanadium (V).

The frequency adjusting film 24 may be made of, for example, a silicon nitride film or aluminum nitride instead of a silicon oxide film. The mass load film 20 may be a single-layer film of Ru, Cr, Al, Cu, Mo, W, Ta, Pt, Rh, or Ir instead of Ti. Alternatively, the mass load film 20 may be an insulating film made of metal nitride such as silicon nitride or metal oxide such as silicon oxide. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers, i.e., between the lower layer 16a and the upper layer 16b, of the upper electrode 16. The mass load film 20 may be larger than the resonance region 50 as long as it is formed to include the resonance region 50.

Figure 2A:
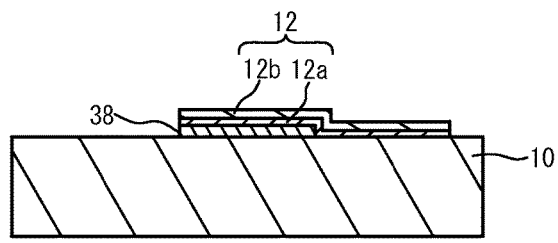
FIG. 2A through FIG. 2D are cross-sectional views (No. 1) illustrating a method of fabricating a series resonator of the first embodiment.

FIG. 2A through FIG. 3D are cross-sectional views illustrating a method of fabricating the series resonator of the first embodiment. As illustrated in FIG. 2A, a sacrifice layer 38 for forming an air gap is formed on the substrate 10 having the flat principal surface. The sacrifice layer 38 has a film thickness of, for example, 10 to 100 nm, and is made of a material selected from materials such as magnesium oxide (MgO), ZnO, germanium (Ge), and silicon oxide ($SiO_2$) that are easily dissolved in etching liquid or etching gas. The sacrifice layer 38 is then patterned into a desired shape by photolithography and etching. The sacrifice layer 38 has a shape corresponding to the planar shape of the air gap 30, and includes, for example, a region to be the resonance region 50. The lower layer 12a and the upper layer 12b as the lower electrode 12 are then formed on the sacrifice layer 38 and the substrate 10. The sacrifice layer 38 and the lower electrode 12 are formed by, for example, sputtering, vacuum evaporation, or Chemical Vapor Deposition (CVD). The lower electrode 12 is then patterned into a desired shape by photolithography and etching. The lower electrode 12 may be formed by liftoff.

Figure 2B:
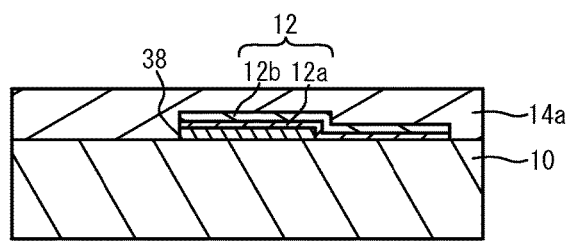
Figure 2C:
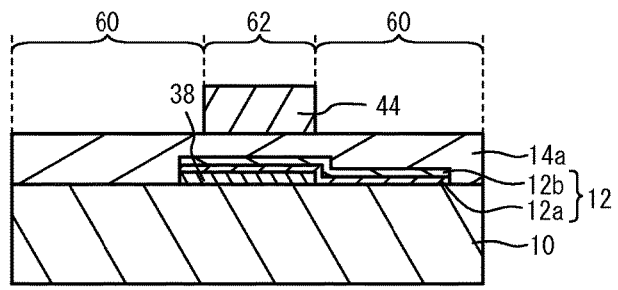
Figure 2D:
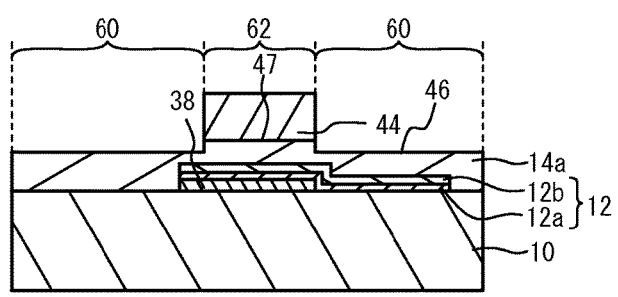

As illustrated in FIG. 2B, the lower piezoelectric film 14a is formed on the lower electrode 12 and the substrate 10 by, for example, sputtering, vacuum evaporation, or CVD. As illustrated in FIG. 2C, a mask layer 44 such as a photoresist is formed on the lower piezoelectric film 14a. The mask layer 44 is not formed in a region 60 where the insertion film 28 is to be formed, and the mask layer 44 is formed in a region 62 where the insertion film 28 is not to be formed. As illustrated in FIG. 2D, the upper surface of the lower piezoelectric film 14a is etched by wet etching or dry etching with use of the mask layer 44 as a mask. This process forms a recessed portion 46 in the upper surface of the lower piezoelectric film 14a. The region 60 corresponds to the bottom of the recessed portion 46, and the region 62 corresponds to a protrusion portion 47.

Figure 3A:
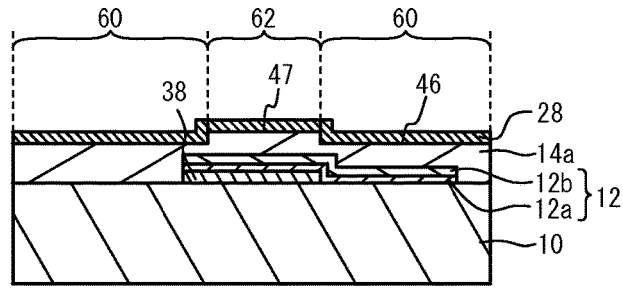
FIG. 3A through FIG. 3D are cross-sectional views (No. 2) illustrating the method of fabricating the series resonator of the first embodiment.
Figure 3B:
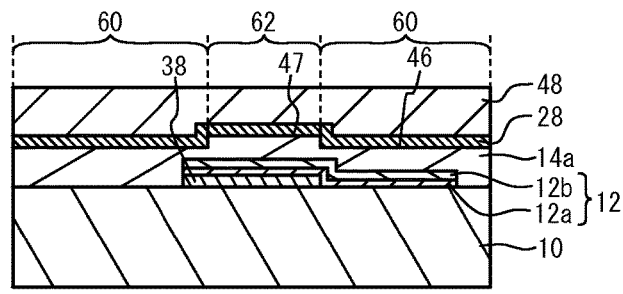
Figure 3C:
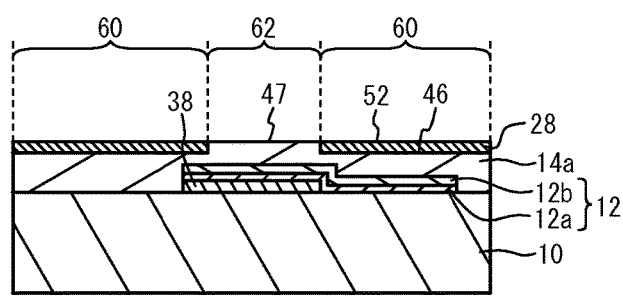

As illustrated in FIG. 3A, the mask layer 44 is removed. The insertion film 28 is formed on the lower piezoelectric film 14a by, for example, sputtering, vacuum evaporation, or CVD. The insertion film 28 has a film thickness approximately equal to or greater than the depth of the recessed portion 46. As illustrated in FIG. 3B, a dummy layer 48 such as a photoresist is formed on the insertion film 28 by, for example, spin coating or spray coating. The dummy layer 48 is formed to have a substantially flat upper surface. As illustrated in FIG. 3C, the dummy layer 48 and the insertion film 28 are etched by, for example, dry etching. At this time, the etching rate of the dummy layer 48 is controlled to be approximately equal to the etching rate of the insertion film 28. The etching is stopped when the insertion film 28 in the region 62 is removed. This process allows the insertion film 28 to remain in the region 60 and allows the insertion film 28 on the protrusion portion 47 of the region 62 to be removed. The insertion film 28 is embedded in the recessed portion 46 in the upper surface of the lower piezoelectric film 14a. The upper surfaces of the insertion film 28 and the lower piezoelectric film 14a form a substantially flat surface.

Figure 3D:
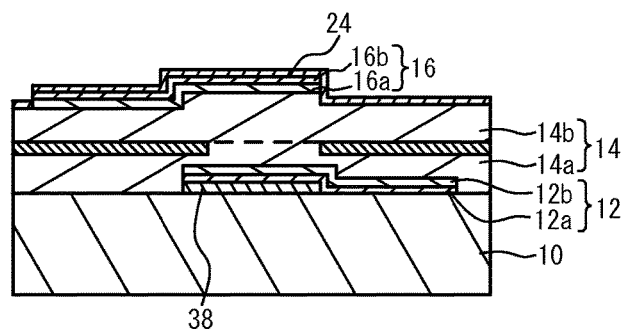

As illustrated in FIG. 3D, the upper piezoelectric film 14b, and the lower layer 16a and the upper layer 16b of the upper electrode 16 are formed by, for example, sputtering, vacuum evaporation, or CVD. The lower piezoelectric film 14a and the upper piezoelectric film 14b form the piezoelectric film 14. The upper electrode 16 is patterned into a desired shape by photolithography and etching. The upper electrode 16 may be formed by liftoff.

In the parallel resonator illustrated in FIG. 1D, the mass load film 20 is formed by, for example, sputtering, vacuum evaporation, or CVD after the lower layer 16a of the upper electrode 16 is formed. The mass load film 20 is patterned into a desired shape by photolithography and etching. The upper layer 16b of the upper electrode 16 is then formed.

The frequency adjusting film 24 is formed by, for example, sputtering or CVD. The frequency adjusting film 24 is patterned into a desired shape by photolithography and etching.

An etching liquid for etching the sacrifice layer 38 is then introduced into the sacrifice layer 38 under the lower electrode 12 through the hole portion 35 and the introduction path 33 (see FIG. 1A). This process removes the sacrifice layer 38. A substance to etch the sacrifice layer 38 is preferably a substance that does not etch materials making up the resonator except the sacrifice layer 38. Especially, an etching substance is preferably a substance that does not etch the lower electrode 12 that comes contact with the etching substance. The stress on the multilayered film 18 (see FIG. 1C, FIG. 1D) is set to be a compression stress. This allows the multilayered film 18 to bulge out opposite to the substrate 10 so as to separate from the substrate 10 when the sacrifice layer 38 is removed. The air gap 30 having a dome-shaped bulge is formed between the lower electrode 12 and the substrate 10. The above described process completes the series resonator S illustrated in FIG. 1A and FIG. 1C and the parallel resonator P illustrated in FIG. 1A and FIG. 1D.

A description will be given of an alternative method of fabricating the piezoelectric thin film resonator of the first embodiment. After the step illustrated in FIG. 3A, the upper surface of the insertion film 28 is flattened by polishing such as Chemical Mechanical Polishing (CMP). The polishing is stopped when the insertion film 28 in the region 62 is removed. This process completes the structure illustrated in FIG. 3C.

Figure 4:
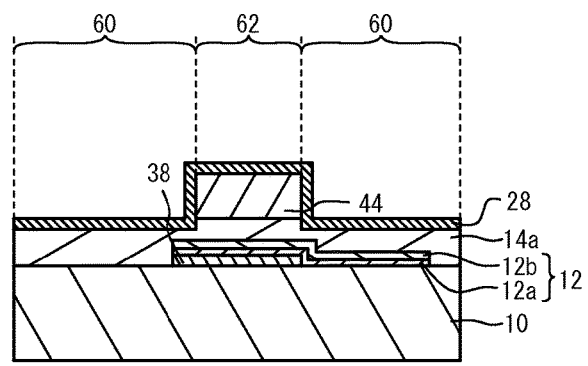
FIG. 4 is a cross-sectional view illustrating an alternative method of fabricating the piezoelectric thin film resonator of the first embodiment.

A description will be given of another alternative method of fabricating the piezoelectric thin film resonator of the first embodiment. FIG. 4 is a cross-sectional view illustrating an alternative method of fabricating the piezoelectric thin film resonator of the first embodiment. As illustrated in FIG. 4, after the step illustrated in FIG. 2D, the insertion film 28 is formed on the lower piezoelectric film 14a and the mask layer 44 by, for example, sputtering or vacuum evaporation without removing the photoresist that is the mask layer 44. When the mask layer 44 is removed, the insertion film 28 on the mask layer 44 is lifted-off. This process completes the structure illustrated in FIG. 3C.

As described above, the first embodiment allows the upper surface of the lower piezoelectric film 14a and the upper surface of the insertion film 28 to form a substantially flat surface.

Figure 5A:
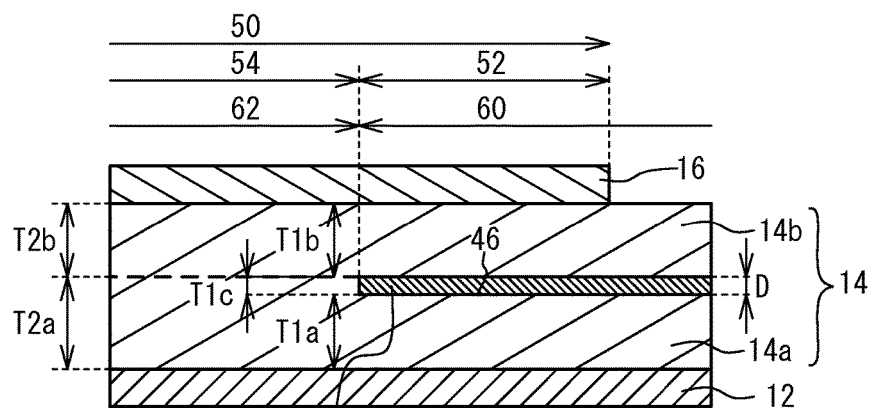
FIG. 5A through FIG. 5C are cross-sectional views illustrating areas around outer peripheral regions of resonance regions of piezoelectric thin film resonators in accordance with the first embodiment, a first comparative example, and a second comparative example, respectively.
Figure 5B:
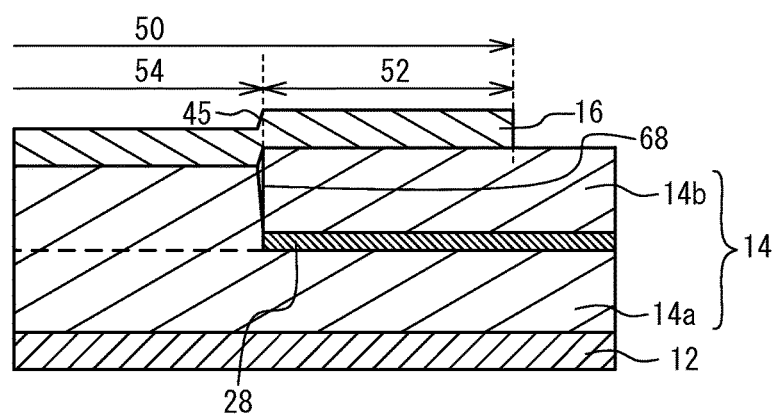
Figure 5C:
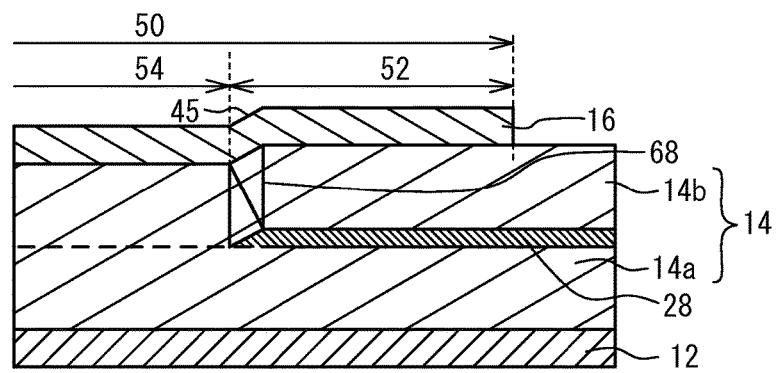

FIG. 5A and FIG. 5C are cross-sectional views illustrating areas around outer peripheral regions of resonance regions of piezoelectric thin film resonators in accordance with the first embodiment, a first comparative example, and a second comparative example. Omitted is the illustration of the elements other than the lower electrode 12, the piezoelectric film 14, the insertion film 28, and the upper electrode 16.

As illustrated in FIG. 5A, in the first embodiment, the insertion film 28 is formed in at least a part of the outer peripheral region of the resonance region 50. This structure prevents the creation of unnecessary Lamb waves in a lateral mode and prevents acoustic wave energy from leaking to the outside of the resonance region 50. Thus, the characteristics, including the Q-value, of the piezoelectric thin film resonator are improved.

Moreover, the recessed portion 46 is formed in the upper surface of the lower piezoelectric film 14a. The region 60 in which the insertion film 28 is inserted corresponds to the recessed portion 46, and the region 62 in which the insertion film 28 is not inserted corresponds to a protrusion portion. As described above, the boundary face between the lower piezoelectric film 14a and the upper piezoelectric film 14b in the region 62 is located above the lower surface of the insertion film 28. The depth D of the recessed portion 46 is approximately equal to the film thickness T1c of the insertion film 28. Accordingly, the upper surface of the insertion film 28 in the region 60 and the upper surface of the lower piezoelectric film 14a in the region 62 form a substantially flat surface. The upper piezoelectric film 14b has approximately the same film thickness in the regions 60 and 62. Thus, the upper piezoelectric film 14b has a flat upper surface. T1a represents the film thickness of the lower piezoelectric film 14a in the region 60, T1b represents the film thickness of the upper piezoelectric film 14b in the region 60, and T1c represents the film thickness of the insertion film 28 in the region 60. T2a represents the film thickness of the lower piezoelectric film 14a in the region 62, and T2b represents the film thickness of the upper piezoelectric film 14b in the region 62. The film thickness T1a+T1c is approximately equal to the film thickness T2a. The film thickness T1b is approximately equal to the film thickness T2b. Thus, the total film thickness T1a+T1b+T1c of the piezoelectric film 14 and the insertion film 28 in the region 60 is approximately equal to the film thickness T2a+T2b of the piezoelectric film 14.

As illustrated in FIG. 5B, in the first comparative example, the lower piezoelectric film 14a has a flat upper surface. The insertion film 28 protrudes with respect to the lower piezoelectric film 14a. When the upper piezoelectric film 14b is formed, discontinuous of crystal occurs in the upper piezoelectric film 14b as indicated by a line 68. The discontinuous of crystal deteriorates the crystallinity of the upper piezoelectric film 14b, and/or reduces the mechanical strength of the upper piezoelectric film 14b. In some situations, the reliability decreases. In addition, irregularities corresponding to the insertion film 28 are formed in the upper surface of the upper piezoelectric film 14b, and a level difference 45 is formed at the boundary between the center region 54 and the outer peripheral region 52. This deteriorates the characteristics of the piezoelectric thin film resonator.

As illustrated in FIG. 5C, in the second comparative example, the side surface of the insertion film 28 is inclined. This structure also forms irregularities in the upper surface of the upper piezoelectric film 14b, and forms the level difference 45 at the boundary between the center region 54 and the outer peripheral region 52. Thus, as with in the first comparative example, the crystallinity of the upper piezoelectric film 14b deteriorates, and the mechanical strength of the upper piezoelectric film 14b is reduced. Moreover, the characteristics of the piezoelectric thin film resonator deteriorate.

The drawing of Patent Document 1 does not illustrate the level difference on the upper surface of the piezoelectric film. This is because the drawing of Patent Document 1 is a schematic drawing. When the insertion film is formed by the fabrication method of Patent Document 1, irregularities corresponding to the insertion film 28 are formed in the upper surface of the piezoelectric film 14 as with in the first comparative example and the second comparative example. This decreases the crystallinity and mechanical strength of the upper piezoelectric film 14b. Moreover, the characteristics of the piezoelectric thin film resonator deteriorate.

Figure 6A:
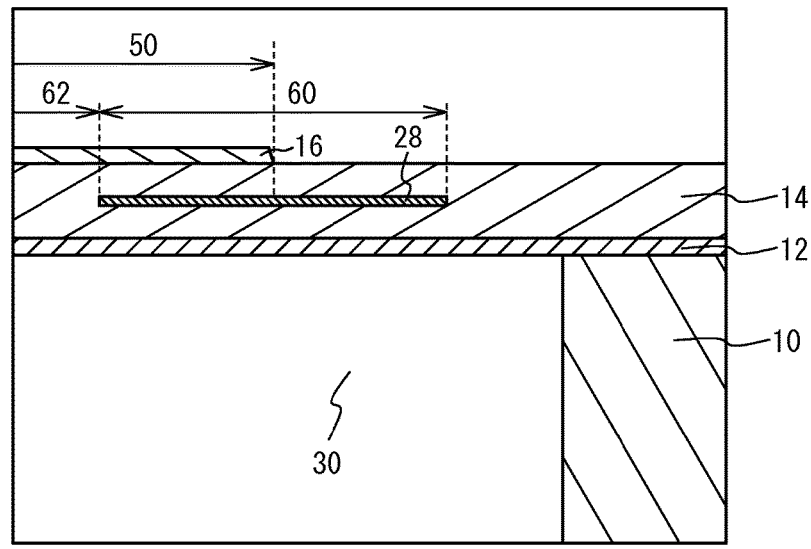
FIG. 6A and FIG. 6B are cross-sectional views of simulated structures of the first embodiment and the first comparative example, respectively.
Figure 6B:
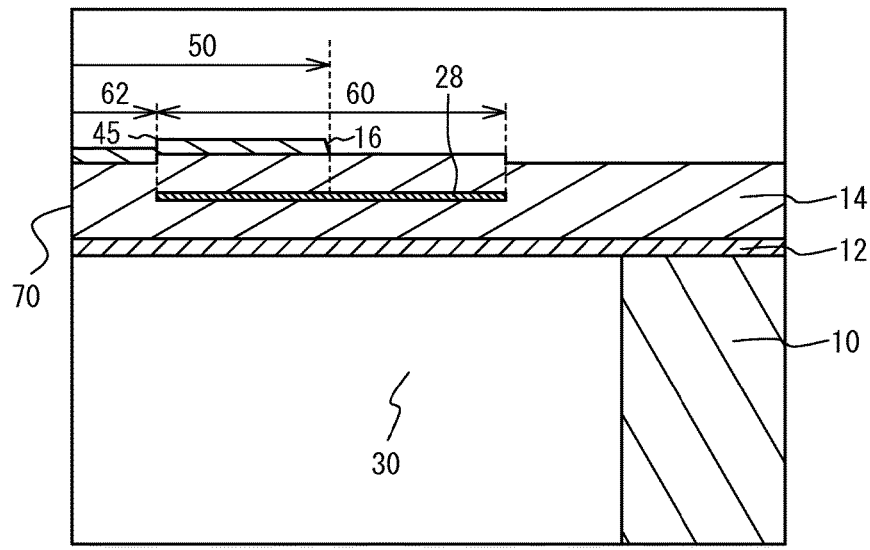

FIG. 6A and FIG. 6B are cross-sectional views of simulated structures of the first embodiment and the first comparative example, respectively. As illustrated in FIG. 6A and FIG. 6B, the simulation was performed on a two-dimensional structure line-symmetric about the center line of the resonance region 50, which is the left end (not illustrated) of FIG. 6A and FIG. 6B.

As illustrated in FIG. 6A, in the first embodiment, the piezoelectric film 14 has a substantially flat upper surface. As illustrated in FIG. 6B, in the first comparative example, the piezoelectric film 14 has irregularities corresponding to the insertion film 28 in the upper surface. The irregularities form the level difference 45 at the boundary between the regions 60 and 62.

In the simulation, the film thickness and the material of each layer of the multilayered film 18 were assumed to be the same as those of the piezoelectric thin film resonator having a resonant frequency of 2 GHz illustrated in FIG. 1A through FIG. 1D. That is to say, the lower piezoelectric film 14a was assumed to be made of AlN with a film thickness of 705 nm, and the upper piezoelectric film 14b was assumed to be made of AlN with a film thickness of 505 nm. The insertion film 28 was assumed to be a silicon oxide ($SiO_2$) film with a film thickness of 150 nm. The width W along which the resonance region 50 overlaps with the insertion film 28 was assumed to be 3 µm. In the first embodiment, a recessed portion with a depth of 150 nm is formed in the upper surface of the lower piezoelectric film 14a, and the insertion film 28 is embedded in the recessed portion.

Figure 7:
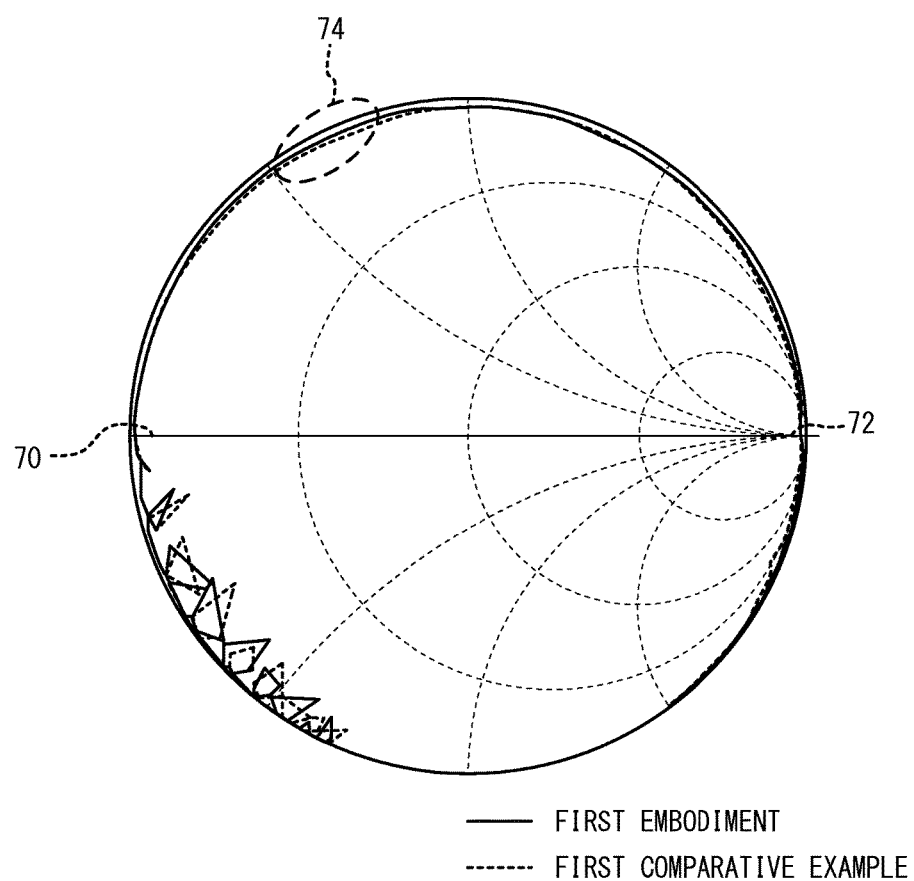
FIG. 7 is a Smith chart of reflection characteristics in the first embodiment and the first comparative example.

FIG. 7 is a Smith chart of reflection characteristics in the first embodiment and the first comparative example. As illustrated in FIG. 7, at a frequency between a resonant frequency 70 and an anti-resonant frequency 72, the deterioration in the first comparative example is greater than that in the first embodiment in an area 74.

Figure 8:
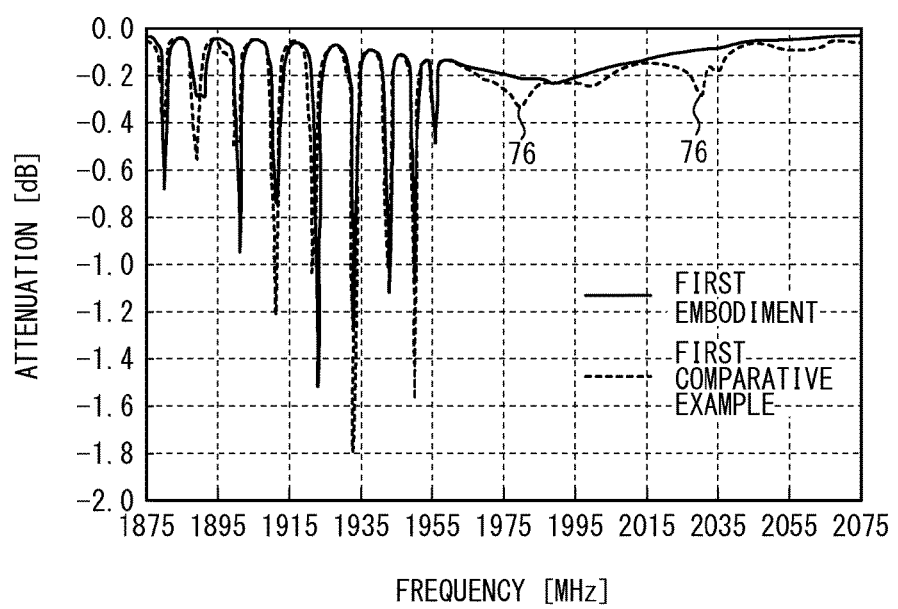
FIG. 8 is a diagram illustrating the reflection characteristics in the first embodiment and the first comparative example.
Figure 9A:
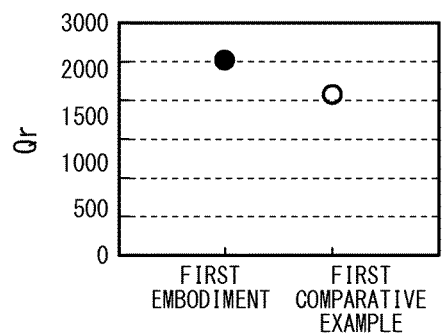
FIG. 9A through FIG. 9E are diagrams respectively illustrating a Q-value Qr at a resonant frequency, a Q-value Qa at an anti-resonant frequency, an effective electromechanical coupling coefficient $k^2$, an FOM, and a maximum Q-value Qmax with respect to frequency in the first embodiment and the first comparative example.
Figure 9B:
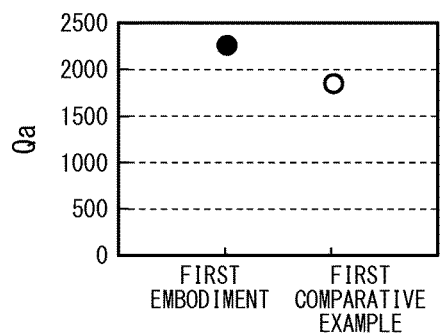
Figure 9C:
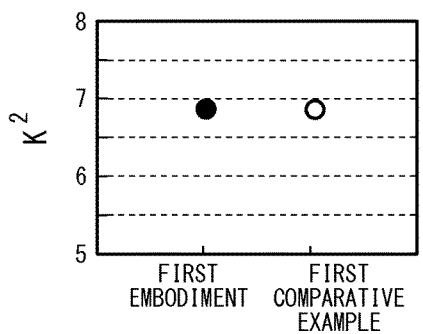
Figure 9D:
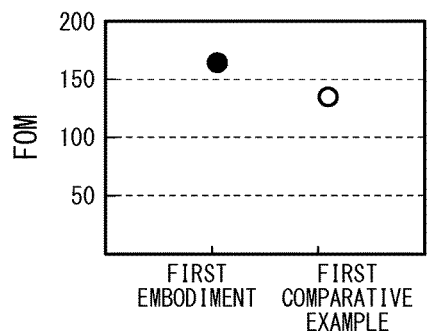
Figure 9E:
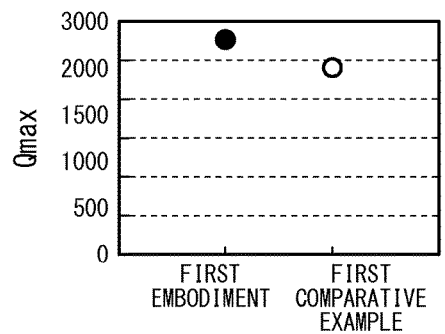

FIG. 8 is a diagram illustrating the reflection characteristics in the first embodiment and the first comparative example. As illustrated in FIG. 8, in the first comparative example, the reflection characteristics deteriorate at frequencies 76. In the first embodiment, the deterioration of the reflection characteristics is hardly observed.

FIG. 9A through FIG. 9E are diagrams respectively illustrating a Q-value Qr at a resonant frequency, a Q-value Qa at an anti-resonant frequency, an effective electromechanical coupling coefficient $k^2$, an FOM, and a maximum Q-value Qmax with respect to frequency in the first embodiment and the first comparative example. As illustrated in FIG. 9A through FIG. 9E, the first embodiment has a greater Q-value Qr at a resonant frequency, a greater Q-value Qa at an anti-resonant frequency, and a greater maximum Q-value Qmax than the first comparative example. Effective electromechanical coupling coefficients $k^2$ are approximately the same between the first embodiment and the first comparative example. Accordingly, the first embodiment has a greater FOM=$k^2 \times \sqrt{(Qr \times Qa)}$ than the comparative example.

As described above, the first embodiment can reduce the deterioration of the reflection characteristics compared to the first comparative example. Moreover, the first embodiment can improve the Q-value without decreasing the effective electromechanical coupling coefficient $k^2$, thus improving the FOM.

It is considered that acoustic waves in the lateral direction are created by the level difference 45 in the first comparative example, and thus the reflection characteristics deteriorate and the Q-value decreases. The first embodiment prevents the formation of the level difference 45, thus preventing the creation of acoustic waves in the lateral direction. This is considered as a reason why the deterioration of the reflection characteristics and the decrease in Q-value are reduced.

Figure 10A:
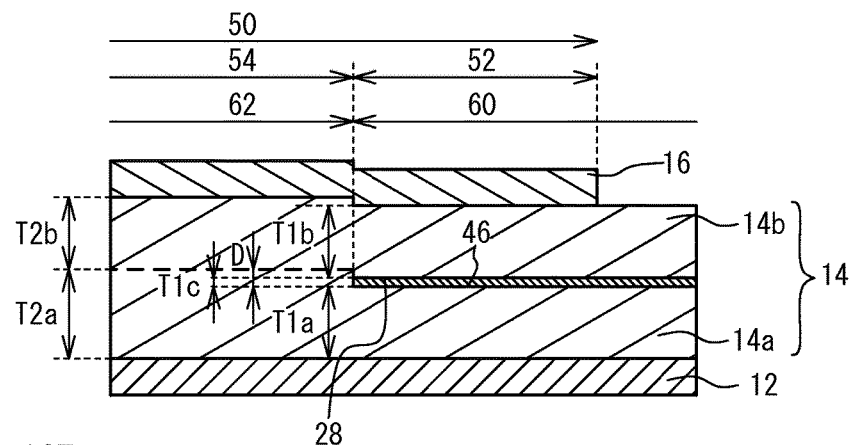
FIG. 10A and FIG. 10B are cross-sectional views illustrating areas around outer peripheral regions of resonance regions of piezoelectric thin film resonators in accordance with first and second variations of the first embodiment.
Figure 10B:
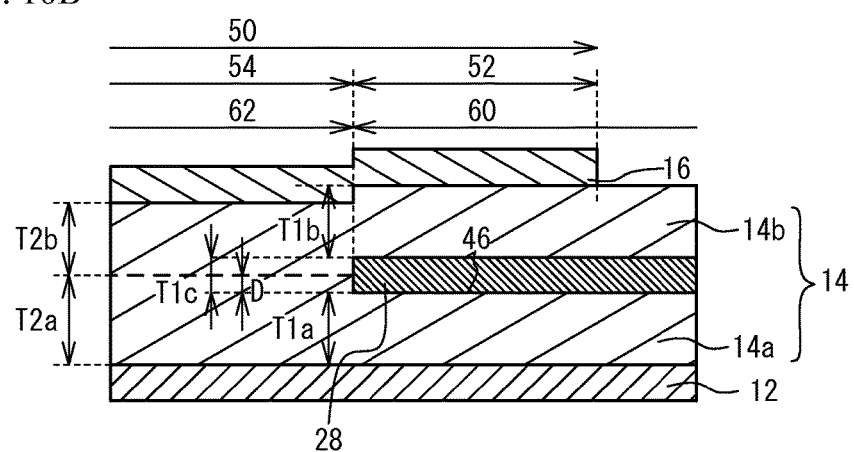

FIG. 10A and FIG. 10B are cross-sectional views illustrating areas around outer peripheral regions of resonance regions of piezoelectric thin film resonators in accordance with first and second variations of the first embodiment. As illustrated in FIG. 10A, in the first variation of the first embodiment, the insertion film 28 has a film thickness T1c less than the depth D of the recessed portion 46. Thus, the total film thickness T1a+T1b+T1c of the piezoelectric film 14 and the insertion film 28 in the region 60 is less than the film thickness T2a+T2b of the piezoelectric film 14 in the region 62.

As illustrated in FIG. 10B, in the second variation of the first embodiment, the insertion film 28 has a film thickness T1c greater than the depth D of the recessed portion 46. Thus, the total film thickness T1a+T1b+T1c of the piezoelectric film 14 and the insertion film 28 in the region 60 is greater than the film thickness T2a+T2b of the piezoelectric film 14 in the region 62.

As described in the first and second variations of the first embodiment, the total film thickness T1a+T1b+T1c of the piezoelectric film 14 and the insertion film 28 in the region 60 may not be equal to the film thickness T2a+T2b of the piezoelectric film 14 in the region 62 as long as the difference between the film thickness T1a+T1b+T1c and the film thickness T2a+T2b is less than the film thickness T1c of the insertion film 28. This configuration reduces irregularities, when the upper piezoelectric film 14b is formed, in the upper surfaces of the lower piezoelectric film 14a and the insertion film 28 compared to the first and second comparative examples. Thus, the characteristics of the piezoelectric thin film resonator are improved compared to the first and second comparative examples. Moreover, the crystallinity and the strength of the upper piezoelectric film 14b are improved.

The first embodiment configures the difference between the total film thickness T1a+T1b+T1c of the piezoelectric film 14 and the insertion film 28 in the region 60 (first region) and the film thickness T2a+T2b of the piezoelectric film 14 in the region 62 (second region) to be less than the film thickness T1c of the insertion film 28 as illustrated in FIG. 5A, FIG. 10A, and FIG. 10B. This configuration allows irregularities in the upper surface of the piezoelectric film 14 in the first embodiment and its variations to be smaller than irregularities in the upper surface of the piezoelectric film 14 in the first and second comparative examples. Thus, the first embodiment and its variations improve the characteristics of the piezoelectric thin film resonator compared to the first and second first comparative examples. Moreover, the crystallinity and the strength of the upper piezoelectric film 14b are improved. To further reduce irregularities in the upper surface of the piezoelectric film 14, the difference between the film thickness T1a+T1b+T1c and the film thickness T2a+T2b is preferably 50% or less of the film thickness T1c of the insertion film 28, and more preferably 20% or less. To make the upper surface of the piezoelectric film 14 flat, the film thickness T1a+T1b+T1c is preferably approximately equal to the film thickness T2a+T2b.

In addition, the recessed portion 46 is formed in the upper surface of the lower piezoelectric film 14a so that the region 60 corresponds to the bottom of the recessed portion 46, and the insertion film 28 is formed on the bottom surface of the recessed portion 46. The formation of the recessed portion 46 in the upper surface of the lower piezoelectric film 14a as described above enables to reduce the level difference between the upper surface of the insertion film 28 in the region 60 and the upper surface of the lower piezoelectric film 14a in the region 62.

The difference between the depth D of the recessed portion 46 and the film thickness T1c of the insertion film 28 is less than the film thickness T1c of the insertion film 28. This allows the difference between the total film thickness T1a+T1b+T1c in the region 60 and the film thickness T2a+T2b of the piezoelectric film 14 to be less than the film thickness T1c of the insertion film 28 as illustrated in FIG. 10A and FIG. 10B. The difference between the depth D and the film thickness T1c is preferably 50% or less of the film thickness T1c of the insertion film 28, and is more preferably 20% or less.

In the resonance region 50, the region where the insertion film 28 is formed preferably coincides with the region where the recessed portion 46 is formed in the planer view. This enables to make the upper surfaces of the lower piezoelectric film 14a and the insertion film 28 more flat.

As described in Patent Document 1, to improve the Q-value, the insertion film 28 preferably has a Young's modulus less than that of the piezoelectric film 14, more preferably 90% or less of a Young's modulus of the piezoelectric film 14, and yet more preferably 80% or less. When the piezoelectric film 14 is mainly composed of AN, the insertion film 28 is preferably mainly composed of at least one of Al, Au, Cu, Ti, Pt, Ta, Cr, or silicon oxide.

Second Embodiment

Figure 11A:
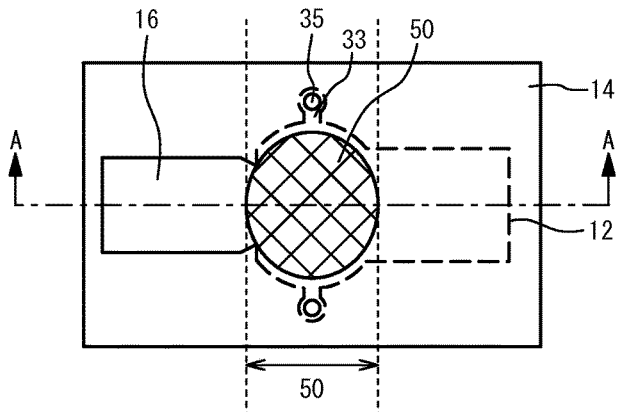
FIG. 11A is a plan view of a piezoelectric thin film resonator in accordance with a second embodiment.
Figure 11B:
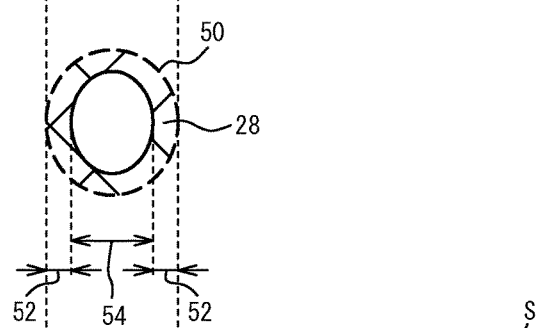
FIG. 11B is a plan view of an insertion film.
Figure 11C:
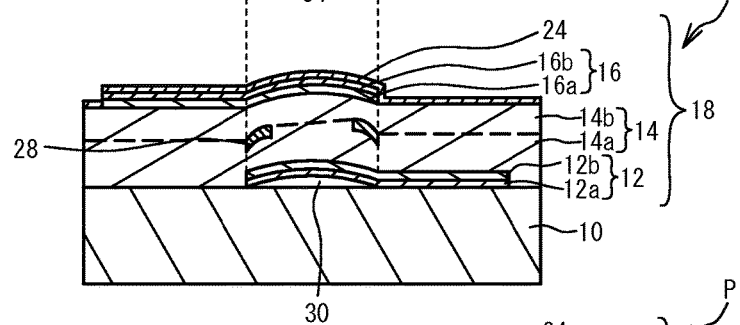
FIG. 11C and FIG. 11D are cross-sectional views taken along line A-A in FIG. 11A.
Figure 11D:
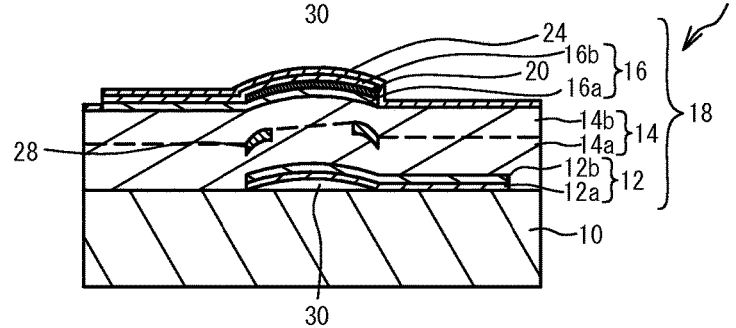

FIG. 11A is a plan view of a piezoelectric thin film resonator in accordance with a second embodiment, FIG. 11B is a plan view of an insertion film, and FIG. 11C and FIG. 11D are cross-sectional views taken along line A-A in FIG. 11A. FIG. 11C is a cross-sectional view of a series resonator, and FIG. 11D is a cross-sectional view of a parallel resonator. As illustrated in FIG. 11A through FIG. 11D, the insertion film 28 is located in the resonance region 50, but is not located outside the resonance region 50. Other structures are the same as those of the first embodiment, and thus the description is omitted.

Figure 12A:
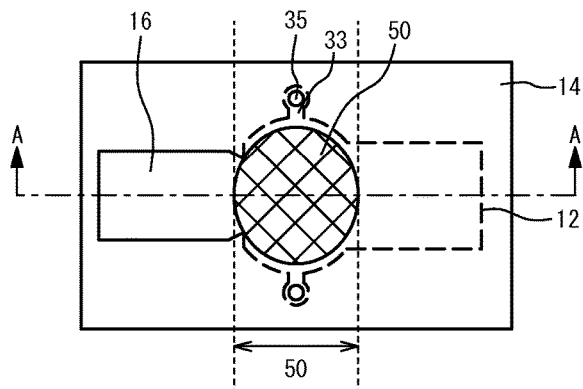
FIG. 12A is a plan view of a piezoelectric thin film resonator in accordance with a first variation of the second embodiment.
Figure 12B:
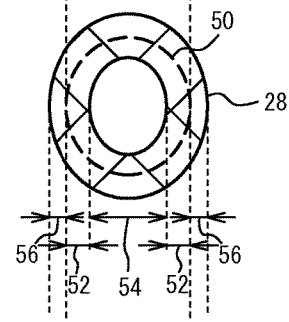
FIG. 12B is a plan view of an insertion film.
Figure 12C:
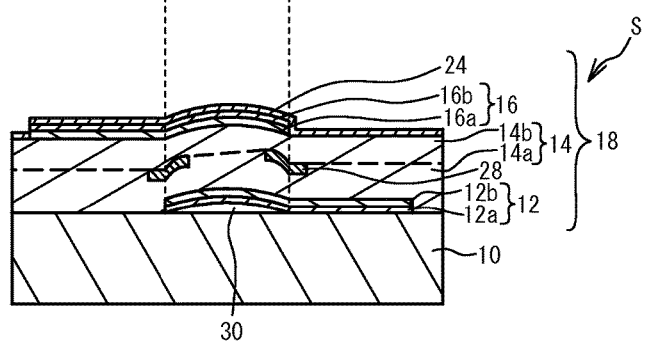
FIG. 12C is a cross-sectional view taken along line A-A in FIG. 12A.

FIG. 12A is a plan view of a piezoelectric thin film resonator in accordance with a first variation of the second embodiment, FIG. 12B is a plan view of an insertion film, and FIG. 12C is a cross-sectional view taken along line A-A in FIG. 12A. FIG. 12C is a cross-sectional view of a series resonator. As illustrated in FIG. 12A through FIG. 12C, the insertion film 28 is located in a region 56 surrounding the resonance region 50 as well as in the outer peripheral region 52. Other structures are the same as those of the second embodiment, and thus the description is omitted.

As described in the first embodiment, the insertion film 28 may be located across the entire surface outside the resonance region 50. As described in the second embodiment, the insertion film 28 may not be located outside the resonance region 50. As described in the first variation of the second embodiment, the insertion film 28 is located in the region 56 surrounding the resonance region 50, and may not be located outside the region 56. Any of the structures can improve the Q-value of the piezoelectric thin film resonator.

Third Embodiment

Figure 13A:
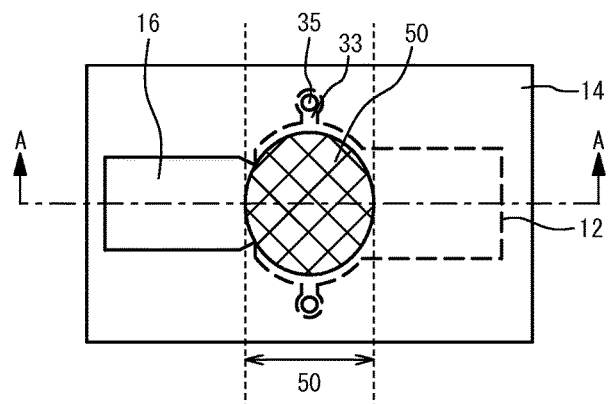
FIG. 13A is a plan view of a piezoelectric thin film resonator in accordance with a third embodiment.
Figure 13B:
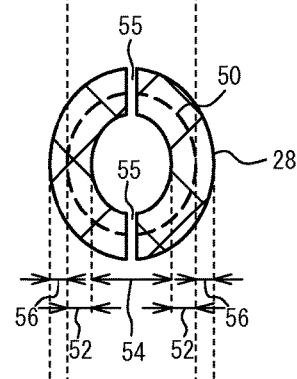
FIG. 13B is a plan view of an insertion film.
Figure 13C:
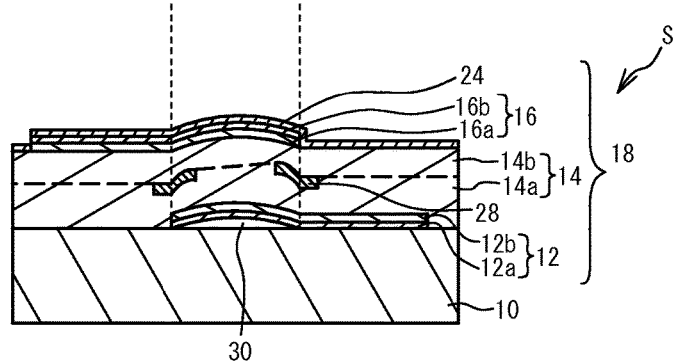
FIG. 13C is a cross-sectional view taken along line A-A in FIG. 13A.

FIG. 13A is a plan view of a piezoelectric thin film resonator in accordance with a third embodiment, FIG. 13B is a plan view of an insertion film, and FIG. 13C is a cross-sectional view taken along line A-A in FIG. 13A. FIG. 13C is a cross-sectional view of a series resonator. As illustrated in FIG. 13A through FIG. 13C, the insertion film 28 is located in a part of the outer peripheral region 52, and the insertion film 28 is not located in a part 55 of the outer peripheral region 52. Other structures are the same as those of the first variation of the second embodiment, and thus the description is omitted.

As described in the third embodiment, the insertion film 28 is only required to be located in at least a part of the outer peripheral region 52. The leakage of the acoustic wave to the outside of the resonance region 50 can be prevented even when the insertion film 28 is located in a part of the outer peripheral region 52. The insertion film 28 is preferably located in 50% or more of the outer periphery of the resonance region 50, more preferably 75% or more, and yet more preferably 90% or more.

In the piezoelectric thin film resonators of the first embodiment, the second embodiment, and its variation, the insertion film 28 may not be located in the part 55 of the outer peripheral region 52.

Fourth Embodiment

Figure 14A:
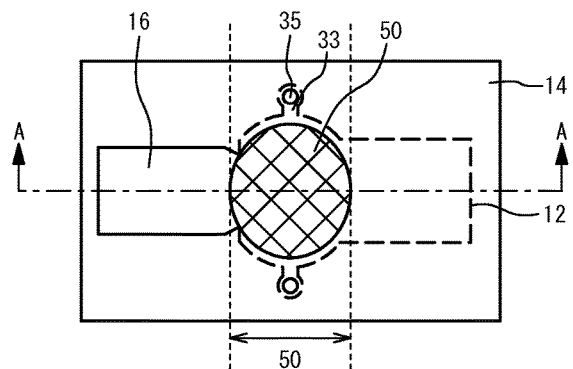
FIG. 14A is a plan view of a piezoelectric thin film resonator in accordance with a fourth embodiment.
Figure 14B:
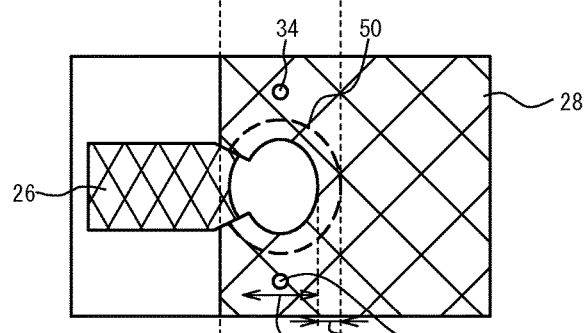
FIG. 14B is a plan view of an insertion film and an additional film.
Figure 14C:
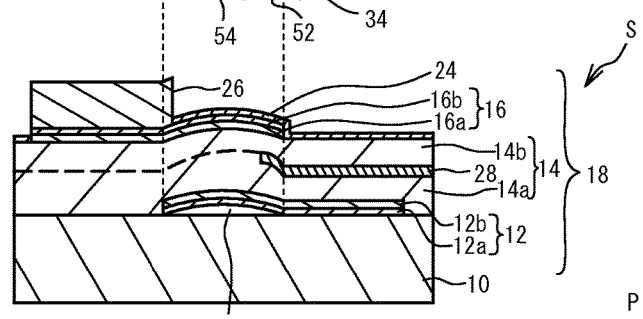
FIG. 14C and FIG. 14D are cross-sectional views taken along line A-A in FIG. 14A.
Figure 14D:
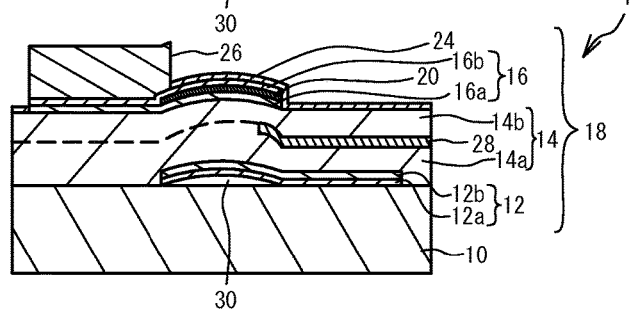

FIG. 14A is a plan view of a piezoelectric thin film resonator in accordance with a fourth embodiment, FIG. 14B is a plan view of an insertion film and an additional film, and FIG. 14C and FIG. 14D are cross-sectional views taken along line A-A in FIG. 14A. FIG. 14C is a cross-sectional view of a series resonator, and FIG. 14D is a cross-sectional view of a parallel resonator. As illustrated in FIG. 14A through FIG. 14D, the insertion film 28 is located in the outer peripheral region 52 overlapping with the lower electrode 12. An additional film 26 is located on the upper electrode 16. The additional film 26 is a multilayered film formed by stacking, for example, a Ti film and a Au film in this order from the bottom side. The additional film 26 prevents acoustic waves from leaking to the outside of the resonance region 50. The additional film 26 may be made of other metal. Other structures are the same as those of the first embodiment, and thus the description is omitted.

As described in the fourth embodiment, the insertion film 28 may be located in a part of the outer peripheral region 52, and the additional film 26 may be located in the remaining region of the outer peripheral region 52. The insertion film 28 and the additional film 26 preferably surround the whole of the outer periphery of the center region 54. The insertion film 28 and the additional film 26 may surround a part of the outer periphery of the center region 54.

The piezoelectric thin film resonators of the first through third embodiments and their variations may include the additional film 26 as described in the fourth embodiment.

Fifth Embodiment

Figure 15A:
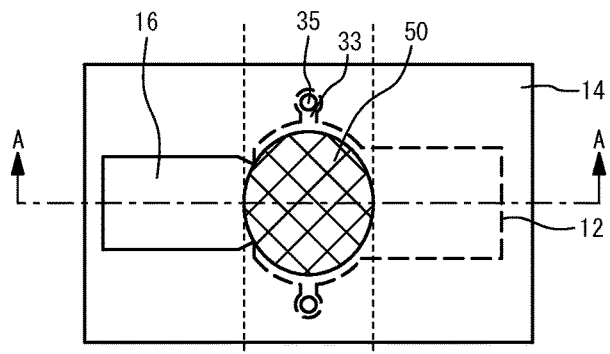
FIG. 15A is a plan view of a piezoelectric thin film resonator in accordance with a fifth embodiment.
Figure 15B:
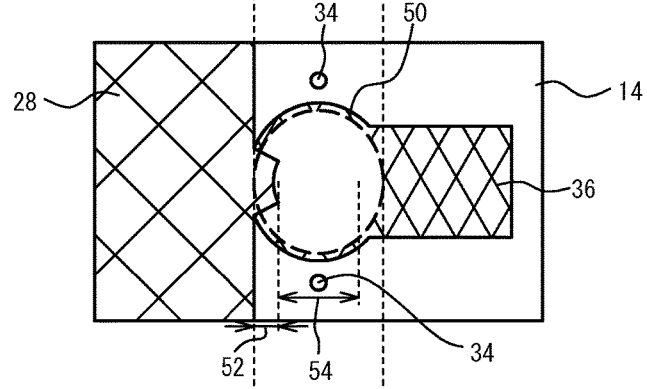
FIG. 15B is a plan view in accordance with an insertion film and an aperture.
Figure 15C:
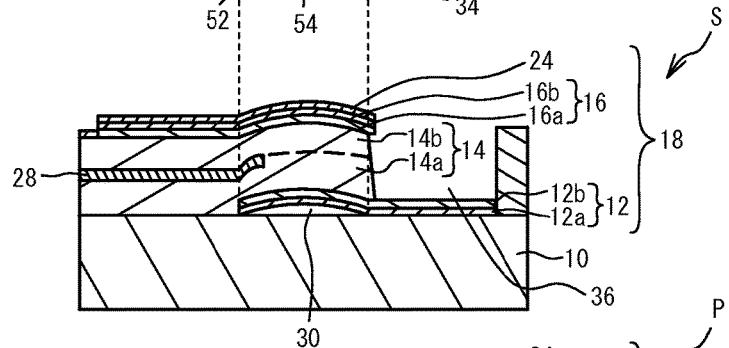
FIG. 15C and FIG. 15D are cross-sectional views taken along line A-A in FIG. 15A.
Figure 15D:
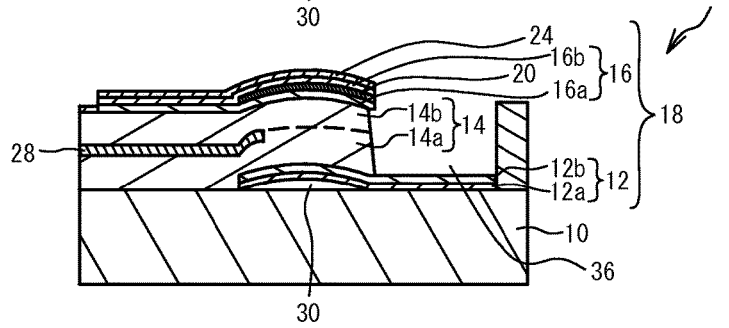

FIG. 15A is a plan view of a piezoelectric thin film resonator in accordance with a fifth embodiment, FIG. 15B is a plan view of an insertion film and an aperture, and FIG. 15C and FIG. 15D are cross-sectional views taken along line A-A in FIG. 15A. FIG. 15C is a cross-sectional view of a series resonator, and FIG. 15D is a cross-sectional view of a parallel resonator. As illustrated in FIG. 15A through FIG. 15D, the insertion film 28 is located in the outer peripheral region 52 overlapping with the upper electrode 16. The piezoelectric film 14 on the lower electrode 12 is removed to form an aperture 36. The piezoelectric film 14 is removed so that the upper electrode 16 forms an eave. The aperture 36 prevents acoustic waves from leaking to the outside of the resonance region 50. The aperture 36 may be located other than on the lower electrode 12 as long as it is located outside the resonance region 50.

As described in the fifth embodiment, the insertion film 28 may be located in a part of the outer peripheral region 52, and the aperture 36 of the piezoelectric film 14 may be located outside the remaining region of the outer peripheral region 52. The insertion film 28 and the aperture 36 preferably surround the whole of the outer periphery of the center region 54. The insertion film 28 and the aperture 36 may surround a part of the outer periphery of the center region 54.

The piezoelectric thin film resonators of the first through third embodiments and their variations may include the aperture 36 as described in the fifth embodiment.

Sixth Embodiment

Figure 16A:
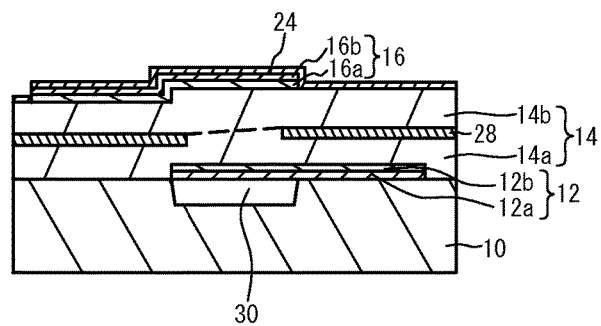
FIG. 16A is a cross-sectional view of a piezoelectric thin film resonator in accordance with a sixth embodiment.
Figure 16B:
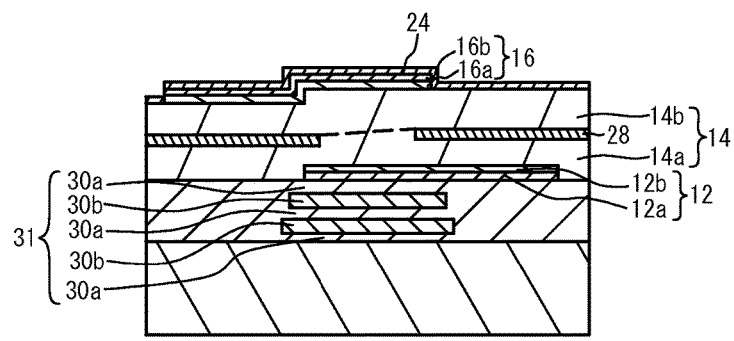
FIG. 16B is a cross-sectional view of a piezoelectric thin film resonator in accordance with a first variation of the sixth embodiment.

A sixth embodiment and its variation change the structure of the air gap. FIG. 16A is a cross-sectional view of a piezoelectric thin film resonator of the sixth embodiment, and FIG. 16B is a cross-sectional view of a piezoelectric thin film resonator of a first variation of the sixth embodiment. As illustrated in FIG. 16A, a recessed portion is formed in the upper surface of the substrate 10. The lower electrode 12 is flatly formed on the substrate 10. This forms the air gap 30 in the recessed portion of the substrate 10. The air gap 30 is formed to include the resonance region 50. Other structures are the same as those of the first embodiment, and thus the description is omitted. The air gap 30 may be formed so as to penetrate through the substrate 10. An insulating film may be formed to make contact with the lower surface of the lower electrode 12. In other words, the air gap 30 may be formed between the substrate 10 and the insulating film making contact with the lower electrode 12. The insulating film may be, for example, an aluminum nitride film.

As illustrated in FIG. 16B, an acoustic mirror 31 is formed under the lower electrode 12 in the resonance region 50. The acoustic mirror 31 is formed by alternately stacking a film 30a with a low acoustic impedance and a film 30b with a high acoustic impedance. The films 30a and 30b have film thicknesses of λ/4 (λ is the wavelength of the acoustic wave). The number of stacking layers of the film 30a and the film 30b are freely selected. Other structures are the same as those of the first embodiment, and thus the description is omitted.

In the first through fifth embodiments and their variations, the air gap 30 may be formed as with in the sixth embodiment, or the acoustic mirror 31 may be formed instead of the air gap 30 as with in the first variation of the sixth embodiment.

As described in the first through sixth embodiments and their variations, the piezoelectric thin film resonator may be a Film Bulk Acoustic Resonator (FBAR) designed to have the air gap 30 formed between the substrate 10 and the lower electrode 12 in the resonance region 50. Alternatively, as described in the first variation of the sixth embodiment, the piezoelectric thin film resonator may be a Solidly Mounted Resonator (SMR) including the acoustic mirror 31, which reflects acoustic waves propagating through the piezoelectric film 14, under the lower electrode 12 in the resonance region 50.

In the first through sixth embodiments and their variations, the resonance region 50 has a shape of an ellipse, but may have other shape. For example, the resonance region 50 may have a polygonal shape such as a quadrangle shape or a pentagonal shape.

Seventh Embodiment

Figure 17:
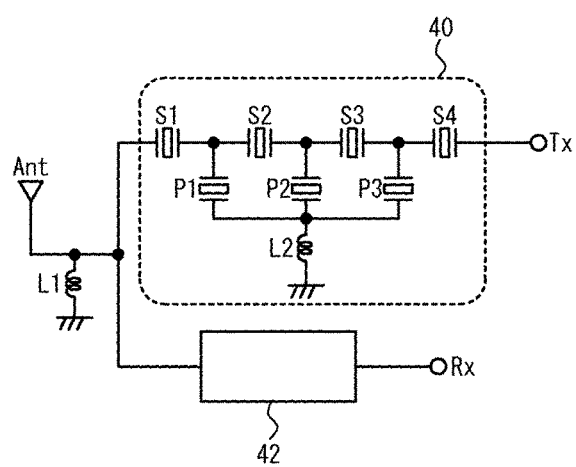
FIG. 17 is a circuit diagram of a duplexer in accordance with a seventh embodiment.

A seventh embodiment is an exemplary duplexer. FIG. 17 is a circuit diagram of a duplexer in accordance with the seventh embodiment. As illustrated in FIG. 17, the duplexer includes a transmit filter 40 and a receive filter 42. The transmit filter 40 is connected between a common terminal Ant and a transmit terminal Tx. The receive filter 42 is connected between the common terminal Ant and a receive terminal Rx. An inductor L1 as a matching circuit is located between the common terminal Ant and a ground. The transmit filter 40 passes signals in the transmit band of signals supplied from the transmit terminal Tx as a transmission signal to the common terminal Ant, and suppresses signals with other frequencies. The receive filter 42 passes signals in the receive band of signals supplied from the common terminal Ant as a reception signal to the receive terminal Rx, and suppresses signals with other frequencies. The inductor L1 matches impedance so that transmission signals transmitted through the transmit filter 40 are output from the common terminal Ant without leaking to the receive filter 42.

The transmit filter 40 is a ladder-type filter. One or more series resonators S1 through S4 are connected in series between the transmit terminal Tx (input terminal) and the common terminal Ant (output terminal). One or more parallel resonators P1 through P3 are connected in parallel between the transmit terminal Tx and the common terminal Ant. Ground side ends of the parallel resonators P1 through P3 are unified and then grounded through an inductor L2. The number of and the connection of the series resonators, the parallel resonators, and the inductors are appropriately changed to obtain desired transmit filter characteristics. Any of the piezoelectric thin film resonators of the first through sixth embodiments and their variations can be used for at least one of the series resonators S1 through S4 and the parallel resonators P1 through P3.

Figure 18A:
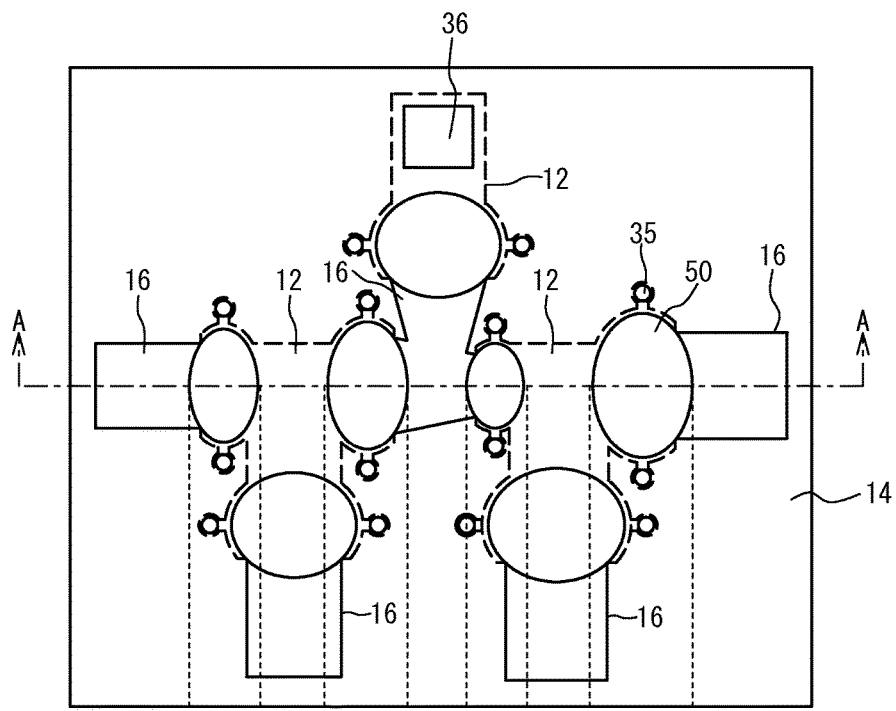
FIG. 18A is a plan view and a cross-sectional view of a transmit filter.
Figure 18B:
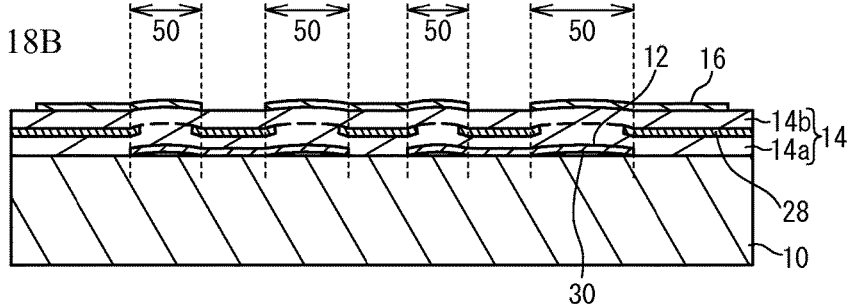
FIG. 18B is a cross-sectional view taken along line A-A in FIG. 18A.

FIG. 18A is a plan view and a cross-sectional view of the transmit filter, and FIG. 18B is a cross-sectional view taken along line A-A in FIG. 18A. As illustrated in FIG. 18A and FIG. 18B, the piezoelectric thin film resonators of the first embodiment may be formed on the single substrate 10 to form a ladder-type filter. The aperture 36 is formed in the piezoelectric film 14, and an aperture of the insertion film 28 is located at a position same as that of the aperture 36. These apertures enable electrical connection to the lower electrode 12 from the outside. Other structures are the same as those of the first embodiment, and thus the description is omitted. The dimensions and the shape of the resonance region 50 of each of the resonators S1 through S4 and P1 through P3 can be appropriately changed.

The receive filter 42 may be a ladder-type filter or a multimode filter. At least one of the transmit filter 40 and the receive filter 42 may be a ladder-type filter or a lattice-type filter. In addition, at least one resonator included in at least one of the transmit filter 40 and the receive filter 42 may be any of the piezoelectric thin film resonators of the first through sixth embodiments and their variations.

A filter includes any of the piezoelectric thin film resonators of the first through sixths embodiments and their variations. This improves the Q-value of the resonator, thus improving the skirt characteristics of the filter.

In addition, at least one of the transmit filter 40 and the receive filter 42 may be a filter including any of the piezoelectric thin film resonators of the first through sixth embodiments and their variations.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
a substrate;
a piezoelectric film located on the substrate;
a lower electrode and an upper electrode facing each other across at least a part of the piezoelectric film; and
an insertion film inserted in the piezoelectric film, located in at least a part of an outer peripheral region within a resonance region, and not located in a center region of the resonance region, the resonance region being a region where the lower electrode and the upper electrode face each other across the piezoelectric film,
wherein a difference between a total film thickness of the piezoelectric film and the insertion film in a first region within the resonance region and a film thickness of the piezoelectric film in a second region is less than a film thickness of the insertion film, the first region being a region in which the insertion film is inserted, and the second region being a region in which the insertion film is not inserted, and
wherein:
the piezoelectric film includes a lower piezoelectric film and an upper piezoelectric film located on the lower piezoelectric film,
a recessed portion is formed in an upper surface of the lower piezoelectric film so that the first region corresponds to a bottom of the recessed portion, and
the insertion film is located on a bottom surface of the recessed portion.

2. The piezoelectric thin film resonator according to claim 1, wherein
a difference between a depth of the recessed portion and the film thickness of the insertion film is less than the film thickness of the insertion film.

3. The piezoelectric thin film resonator according to claim 1, wherein the total film thickness of the piezoelectric film and the insertion film in the first region is equal to the film thickness of the piezoelectric film in the second region.

4. The piezoelectric thin film resonator according to claim 1, wherein
the insertion film has a Young's modulus less than a Young's modulus of the piezoelectric film.

5. The piezoelectric thin film resonator according to claim 1, wherein
an air gap is formed between the substrate and the lower electrode or between the substrate and an insulating film making contact with the lower electrode in the resonance region.

6. The piezoelectric thin film resonator according to claim 1, further comprising:
an acoustic mirror under the lower electrode in the resonance region, the acoustic mirror reflecting acoustic waves propagating through the piezoelectric film.

7. A filter comprising:
the piezoelectric thin film resonator according to claim 1.

8. A duplexer comprising:
a transmit filter; and
a receive filter,
wherein at least one of the transmit filter and the receive filter is the filter according to claim 7.

* * * * *